United States Patent
Foster et al.

(10) Patent No.: US 8,970,343 B2
(45) Date of Patent: Mar. 3, 2015

(54) RETEACHABLE SWITCHING CIRCUIT WITH ABILITY FOR LOCKING

(71) Applicant: Rockwell Automation Technologies, Inc., Mayfield Heights, OH (US)

(72) Inventors: Wayne R. Foster, Tyngsborough, MA (US); Joshua D. Vavra, Derry, NH (US); Steven R. Tambeau, Marlborough, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/936,969

(22) Filed: Jul. 8, 2013

(65) Prior Publication Data
US 2013/0293346 A1    Nov. 7, 2013

Related U.S. Application Data

(63) Continuation of application No. 12/610,793, filed on Nov. 2, 2009, now Pat. No. 8,482,376.

(51) Int. Cl.
| | |
|---|---|
| *G08B 29/00* | (2006.01) |
| *G05B 19/00* | (2006.01) |
| *G06K 11/00* | (2006.01) |
| *G08C 17/00* | (2006.01) |
| *H04L 9/32* | (2006.01) |
| *H04Q 1/00* | (2006.01) |
| *G08B 5/22* | (2006.01) |

(Continued)

(52) U.S. Cl.
CPC ............ *G07C 9/00111* (2013.01); *H03K 17/00* (2013.01); *H03K 2217/94089* (2013.01)
USPC ........... 340/5.6; 340/5.2; 340/5.22; 340/5.23; 340/5.65; 340/5.31; 340/5.63; 340/5.7; 340/5.74; 340/6.11; 455/118; 455/119

(58) Field of Classification Search
CPC ................ G07C 9/00817; G07C 2009/00888; G07C 2009/00849; G07C 1/32; G07C 2009/00238; G07C 2009/00468; G07C 9/00015; G07C 9/00571; G07C 9/0069
USPC ................................................. 340/5.1–5.92
See application file for complete search history.

(56) References Cited

U.S. PATENT DOCUMENTS 3,967,261 A * 6/1976 Fudaley ............................. 173/2
4,274,080 A * 6/1981 Brunken ....................... 340/5.23

(Continued)

FOREIGN PATENT DOCUMENTS

EP      0970859  A2      1/2000

OTHER PUBLICATIONS

European Search Report (extended); Application No. 10189733.8-2215; Feb. 15, 2011.

*Primary Examiner* — Steven Lim
*Assistant Examiner* — Muhammad Adnan
(74) *Attorney, Agent, or Firm* — Fletcher Yoder, P.C.

(57) ABSTRACT

A method for teaching a switching circuit is provided. The method includes presenting a target within a sensing range of a sensor of the switching circuit for a pre-determined duration and acquiring an identification code of the target via the sensor. The method also includes storing the acquired identification code for operating the switching circuit and locking the switching circuit against learning identification codes of any other target prior to reaching an allowed number of reteaching attempts.

17 Claims, 7 Drawing Sheets

(51) Int. Cl.
*G08B 25/00* (2006.01)
*H01Q 11/12* (2006.01)
*H04B 1/04* (2006.01)
*G07C 9/00* (2006.01)
*H03K 17/00* (2006.01)

(56) References Cited

U.S. PATENT DOCUMENTS

| | | | | |
|---|---|---|---|---|
| 4,519,228 A * | 5/1985 | Sornes | | 70/276 |
| 4,750,118 A * | 6/1988 | Heitschel et al. | | 700/90 |
| 5,371,735 A * | 12/1994 | Denneau et al. | | 370/351 |
| 5,547,155 A * | 8/1996 | Herting | | 248/219.2 |
| 5,751,072 A * | 5/1998 | Hwang | | 307/10.4 |
| 5,774,064 A * | 6/1998 | Lambropoulos et al. | | 340/12.29 |
| 5,781,143 A * | 7/1998 | Rossin | | 341/173 |
| 6,025,780 A * | 2/2000 | Bowers et al. | | 340/572.3 |
| 6,282,152 B1 * | 8/2001 | Kurple | | 368/10 |
| 6,310,548 B1 * | 10/2001 | Stephens et al. | | 340/540 |
| 6,864,792 B2 * | 3/2005 | Labit et al. | | 340/572.1 |
| 7,057,494 B2 * | 6/2006 | Fitzgibbon | | 340/5.7 |
| 7,311,247 B1 * | 12/2007 | Lenner | | 235/380 |
| 7,429,910 B2 * | 9/2008 | Domenz et al. | | 340/5.23 |
| 7,450,015 B2 * | 11/2008 | Singer et al. | | 340/573.4 |
| 7,548,159 B2 | 6/2009 | Pullmann et al. | | |
| 7,573,693 B2 | 8/2009 | Hornung | | |
| 7,667,595 B2 * | 2/2010 | Komiya et al. | | 340/540 |
| 7,737,820 B2 * | 6/2010 | Flick | | 340/5.22 |
| 7,855,633 B2 * | 12/2010 | Chuey | | 340/5.26 |
| 7,986,220 B2 * | 7/2011 | Kiyomasa et al. | | 340/286.02 |
| 8,385,824 B2 * | 2/2013 | Bakshi et al. | | 455/41.2 |
| 8,416,054 B2 * | 4/2013 | Fitzgibbon | | 340/5.22 |
| 2002/0032976 A1 | 3/2002 | Riener | | |
| 2002/0118111 A1 * | 8/2002 | Brown et al. | | 340/573.1 |
| 2003/0234719 A1 * | 12/2003 | Denison et al. | | 340/5.23 |
| 2005/0088293 A1 * | 4/2005 | Buck et al. | | 340/445 |
| 2006/0153383 A1 * | 7/2006 | Bejean | | 380/270 |
| 2006/0181417 A1 * | 8/2006 | Pullmann et al. | | 340/545.2 |
| 2007/0216531 A1 * | 9/2007 | Lee | | 340/572.1 |
| 2008/0016347 A1 * | 1/2008 | Maj et al. | | 713/168 |
| 2008/0018472 A1 * | 1/2008 | Dasilva et al. | | 340/572.4 |
| 2008/0184622 A1 * | 8/2008 | Mullet et al. | | 49/26 |
| 2008/0238885 A1 | 10/2008 | Zachut et al. | | |
| 2011/0102132 A1 * | 5/2011 | Foster et al. | | 340/5.1 |

* cited by examiner

RETEACHABLE SWITCHING CIRCUIT WITH ABILITY FOR LOCKING

CROSS REFERENCE TO RELATED APPLICATIONS

This application is a continuation of U.S. patent application Ser. No. 12/610,793, entitled "Reteachable Switching Circuit with Ability for Locking," filed Nov. 2, 2009, which is herein incorporated by reference.

BACKGROUND

The invention relates generally to switching devices, such as for machine guarding in industrial applications, and particularly to reteachable switching circuits with an ability for locking Certain switching devices are known and are in use for controlling devices in technical installations in a manner to prevent human access to machines, such as presses and so forth. Typically, such switching devices are configured to facilitate partial or complete shutdown of electrically driven machines/devices of the technical installation to avoid or reduce the opportunities of access to equipment when operational.

One typical application of such a switching device is a door switch that includes an actuator-sensor combination for detecting an open state of an access door of the technical installation (e.g., a press). Typically, the actuator is coded with a unique identification code that is utilized by the sensor to detect the open state of the access door. In general, it is desirable to provide switching devices that can be retaught new actuators. However, certain users of such devices require the switching devices to be locked against reteaching of new actuators.

Certain manufacturers provide separate switching devices having different catalogue numbers for re-programmable and non re-programmable switches. However, this results in double inventory of the switching devices which may be expensive to maintain.

Accordingly, it would be desirable to provide a switching device that can be retaught new actuators, while providing the flexibility of locking the device against reteaching of new targets.

BRIEF DESCRIPTION

Briefly, according to one embodiment of the present invention, a method for teaching a switching circuit is provided. The method includes presenting a target within a sensing range of a sensor of the switching circuit for a pre-determined duration and acquiring an identification code of the target via the sensor. The method also includes storing the acquired identification code for operating the switching circuit and locking the switching circuit against learning identification codes of any other target prior to reaching an allowed number of reteaching attempts.

In accordance with another aspect, a method for teaching a switching circuit is provided. The method includes presenting a target within a sensing range of a sensor of the switching circuit for a pre-determined duration, acquiring an identification code of the target via the sensor and storing the acquired identification code for operating the switching circuit. The method also includes moving the target outside the sensing range of the sensor and re-presenting the target within the sensing range of the sensor within a pre-determined period to lock the switching circuit against learning identification codes of any other target prior to reaching an allowed number of reteaching attempts.

In accordance with another aspect, a reteachable switching circuit is provided. The reteachable switching circuit includes a non-contact sensor and a target movable into and out of a sensing range of the sensor. The reteachable switching circuit also includes a processor configured to reteach the switching circuit for operation of the switching circuit based upon an identification code of the target and to lock the switching circuit against further reteaching based upon other identification codes of any other targets prior to reaching an allowed number of reteaching attempts.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide a method for reteaching a switching circuit such as non-contact switching circuits employed for machine guarding in industrial applications. In particular, the present technique provides a switching circuit that can be re-taught for a new target without any operator manipulation of the switching circuit. Further, the present technique also provides a locking mechanism for the switching circuit that enables locking of the switching circuit against learning a new target prior to reaching an allowed number of reteaching attempts.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
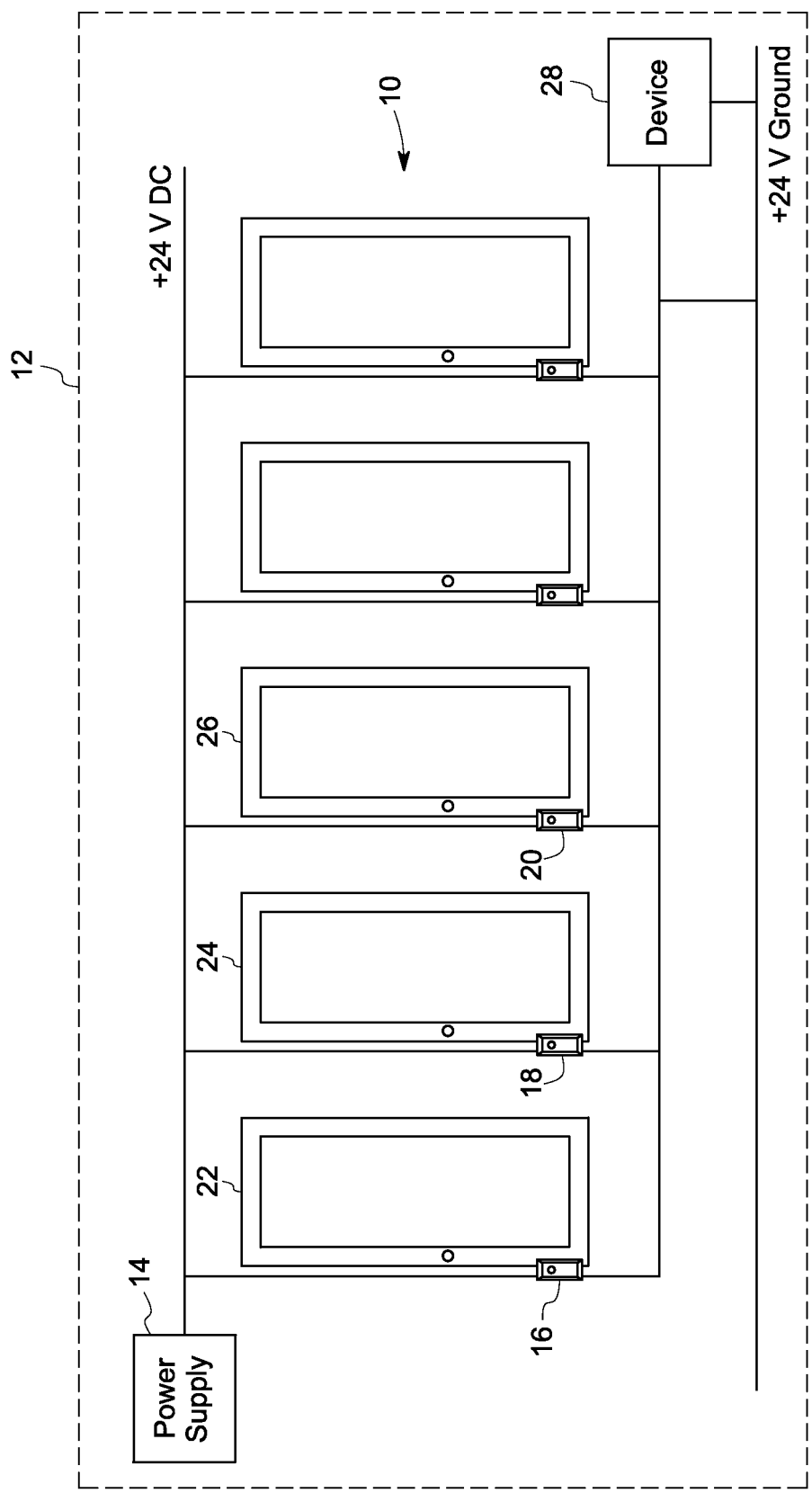
FIG. 1 illustrates a technical installation such as an electrical machine within a controlled access environment in accordance with aspects of the present invention.

Turning now to drawings and referring first to FIG. 1, a technical installation such as an electrical machine 10 within a controlled access environment 12 is illustrated. The machine 10 includes a power supply 14 to power a plurality of switching circuits 16, 18 and 20 disposed on access doors 22, 24 and 26 respectively of the installation. In the illustrated embodiment, the power supply 14 includes a 24 volts DC power supply. The switching circuits 16, 18 and 20 are configured to monitor position of each of the access doors 22, 24 and 26 and to interrupt operation of the installation completely or partially to prevent uncontrolled access to the installation when the doors 22, 24 and 26 are open.

In the illustrated embodiment, each of the switching circuits 16, 18 and 20 includes a non-contact sensor disposed on a stationary component such as a frame of each of the access doors 22, 24 and 26 and a target such as an actuator disposed on a movable component such as on surface of each of the access doors 22, 24 and 26. In a closed state of the access doors 22, 24 and 26, the actuator is located within the sensing range of the sensor, which causes an enable signal to be generated. Alternatively, in an open state of any of the access doors 22, 24 and 26, the actuator is removed from the sensing range of the sensor, which generates a switching signal for interrupting operation of one or more components of the installation completely or partially through one or more devices, such as represented by reference numeral 28.

In certain embodiments, the machine 10 includes output signal switching devices (OSSDs) that are configured to switch DC powered devices, such as contactors and control relays of the installation. In one exemplary embodiment, the OSSDs include PNP type transistors with short circuit protection, overload protection and crossfault detection.

In this exemplary embodiment, the switching circuits 16, 18 and 20 utilize radio frequency identification for coding of the actuator and induction for sensing by the sensor. The teaching of such switching circuits 16, 18 and 20 will be described in detail below with reference to FIGS. 4-6. In certain embodiments, the devices 28 include machine actuators or logic devices such as monitoring relays configured to interrupt one or more components of the installation. The monitoring relays may include two or more guided relays with additional circuitry to ensure performance of the access limiting function.

Figure 2:
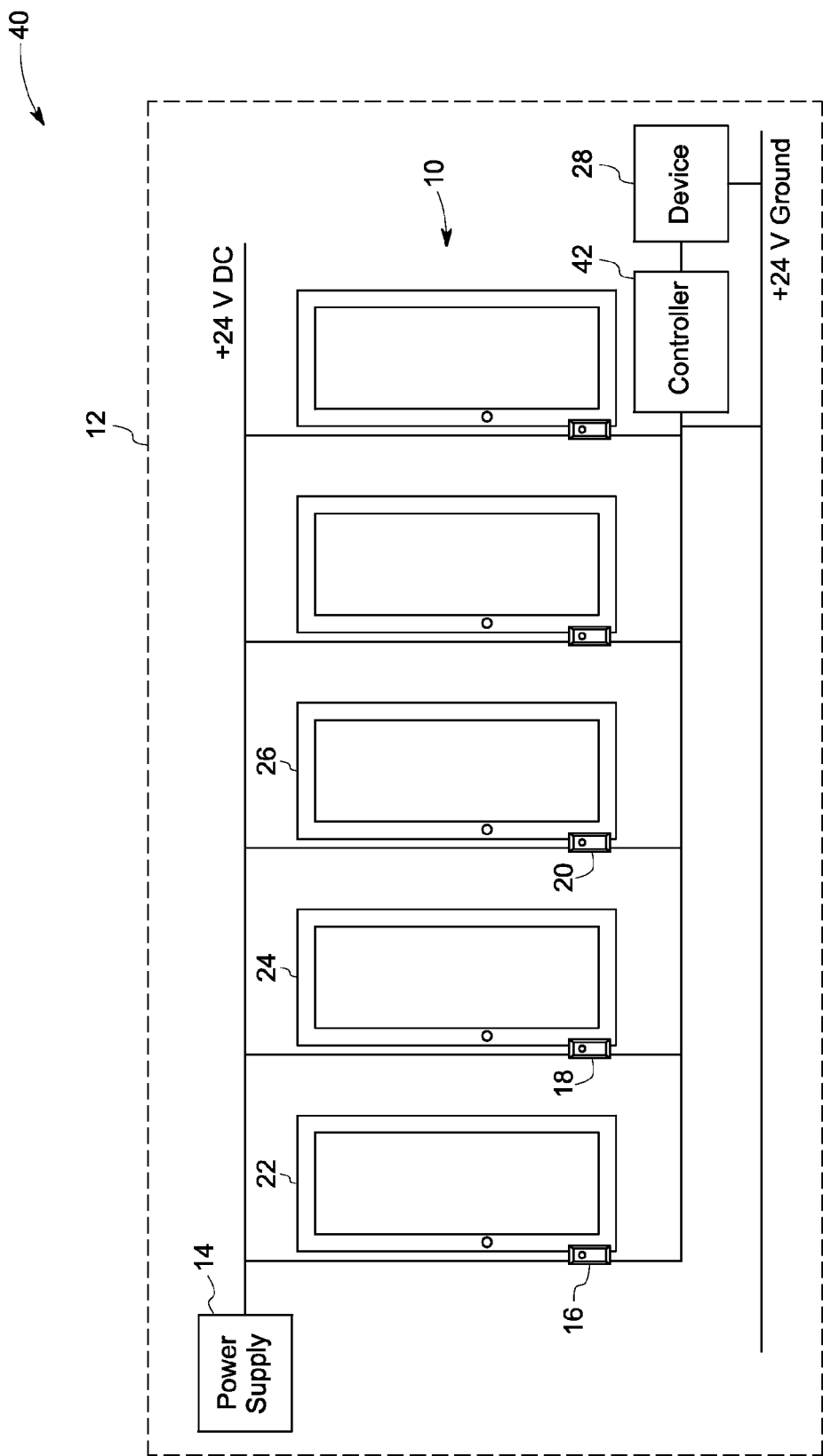
FIG. 2 illustrates another exemplary embodiment of an installation of FIG. 1 in accordance with aspects of the present invention.

FIG. 2 illustrates another exemplary embodiment 40 of an installation 10 of FIG. 1. As illustrated, the installation 40 includes switching circuits 16, 18 and 20 for monitoring a position of each of the access doors 22, 24 and 26. In this embodiment, the installation 10 includes a controller 42 configured to receive switching signals from the switching devices 16, 18 and 20 and to generate output signals for the devices 28. In certain embodiments, the controller 42 includes a programmable logic controller (PLC) with solid-state outputs. In operation, the devices 28 may be operated by the controller 42 in response to signals from the switching circuits 16, 18 and 20. Thus, the devices 28 may shut down or interrupt operation of certain devices of the installation 40 if the switching circuits 16, 18 and 20 detect any of the access doors 22, 24 and 26 in an open state.

Figure 3:
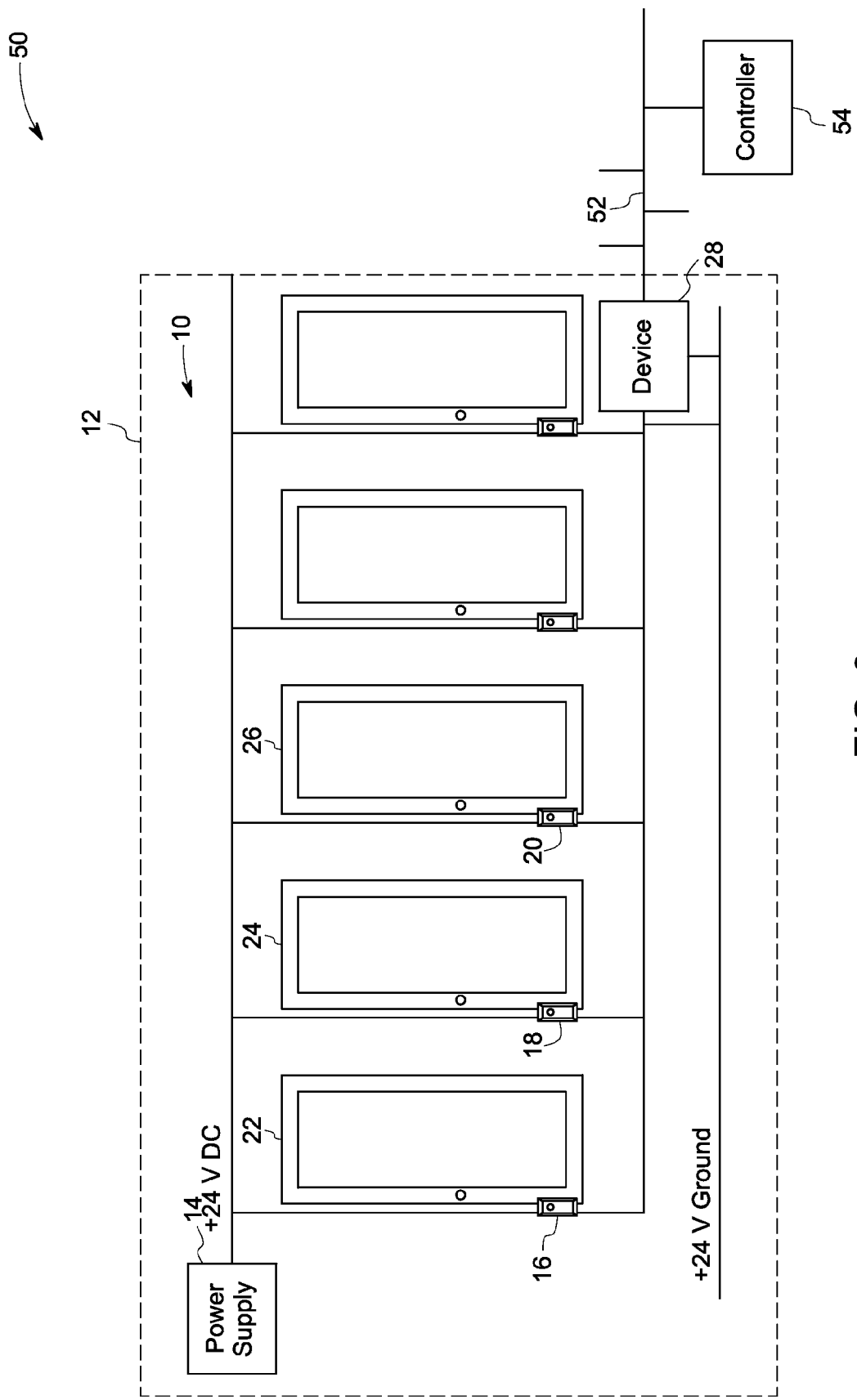
FIG. 3 illustrates another exemplary embodiment of the installation of FIG. 1 in accordance with aspects of the present invention.

FIG. 3 illustrates another exemplary embodiment 50 of the installation 10 of FIG. 1. In this embodiment, the installation 50 includes a network 52 to receive switching signals from the switching circuits 16, 18 and 20 and to control operation of the devices 28. In certain embodiments, the installation 50 includes a remote controller 54 communicatively coupled to the network 52 to analyze the switching signals and to control the operation of the devices 28 to shut down or interrupt operation of certain equipment of the installation 50 based upon such switching signals. As will be appreciated by one skilled in the art the network 52 may include components such as network cables, network interface cards, routers and bridges to communicate with the devices 28 and the controller 54.

As described above, each of the switching circuits 16, 18 and 20 includes the sensor and the target that has a unique identification code. Each of the switching circuits 16, 18 and 20 is configured to be retaught a new target without operator manipulation of the switching circuits 16, 18 and 20. Furthermore, an operator can lock each of the switching circuits 16, 18 and 20 against further reteaching of any other targets as will be described below.

Figure 4:
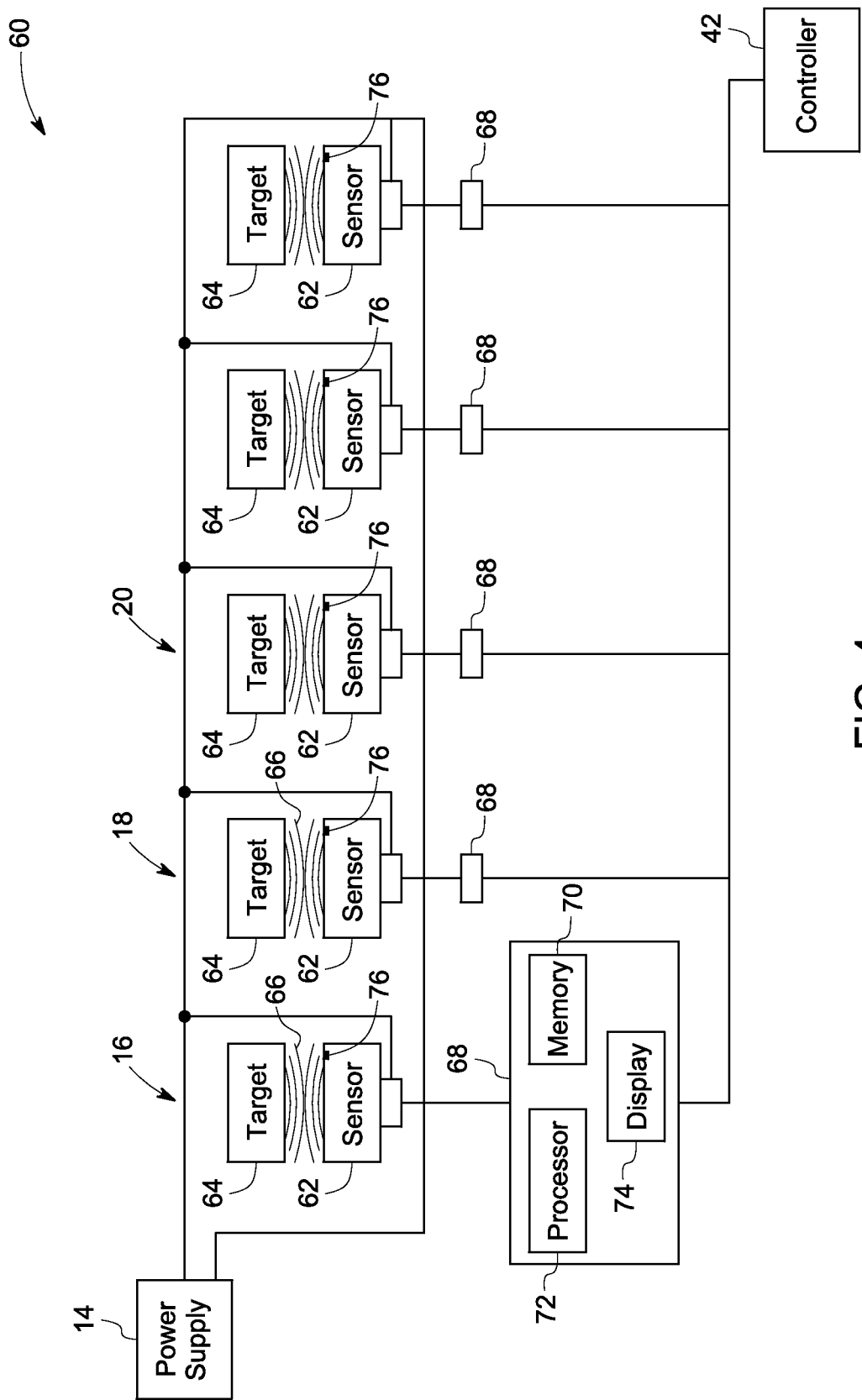
FIG. 4 illustrates an exemplary configuration of the switching circuits employed in the installations of FIGS. 1, 2 and 3, respectively, in accordance with aspects of the present invention.

FIG. 4 illustrates an exemplary configuration 60 of the switching circuits 16, 18 and 20 employed in the installations 10, 40 and 50 of FIGS. 1, 2 and 3 respectively. Each of the switching circuits 16, 18 and 20 includes a non-contact sensor 62 and a target 64 movable into and out of a sensing range of the sensor 62. In one embodiment, the sensing range of the sensor 62 is between about 10 mm and about 25 mm. In the illustrated embodiment, the sensor 62 is disposed on a stationary component such as frame of the access door 22 (see FIG. 1). Further, the target 64 includes an actuator disposed on a movable component such as the access door 22.

The actuator 64 is coded with an identification code using radio frequency identification. In one exemplary embodiment, the identification code includes a 16-bit word. In operation, the sensor 62 generates a radio frequency field, generally represented by reference numeral 66, at frequency of about 125 kHz and the target 64 is a passive resonant circuit that responds to excitation by the radio frequency field. Moreover, each of the switching circuits 16, 18 and 20 includes components 68 for reteaching the switching circuits 16, 18 and 20.

In particular, each of the switching circuits 16, 18 and 20 includes a memory 70 configured to store a plurality of identification codes of other targets previously used by the switching circuits 16, 18 and 20 respectively as a basis for switching. The memory 70 may include hard disk drives, optical drives, tape drives, random access memory (RAM), read-only memory (ROM), programmable read-only memory (PROM), redundant arrays of independent disks (RAID), flash memory, magneto-optical memory, holographic memory, bubble memory, magnetic drum, memory stick, Mylar® tape, smartdisk, thin film memory, zip drive, and so forth.

Further, each of the switching circuits 16, 18 and 20 includes a processor 72 configured to reteach the switching circuits 16, 18 and 20 for the target if an acquired identification of the target is different from all stored identification codes previously used by the switching circuits 16, 18 and 20 respectively as a basis for switching. In addition, each of the switching circuits 16, 18 and 20 includes a display 74 to display warning messages if the identification code of the target is identical to any stored identification code previously used by the switching circuits 16, 18 and 20 respectively as the basis for switching.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output. It should also be noted that the phrase "configured to" as used herein means that the processor is equipped with a combination of hardware and software for performing the tasks of the invention, as will be understood by those skilled in the art.

In certain embodiments, each of the switching circuits 16, 18 and 20 may include a buffer memory (not shown) configured to store sensing data corresponding to the target 64 within a pre-determined duration to validate the acquired identification code of the target 64. In one exemplary embodiment, the pre-determined duration is about 15 secs. It should be noted that the processor 72 is configured to reprogram the switching circuit such as 16 without operator manipulation of the switching circuit 16. Advantageously, the reteaching of the switching circuits 16, 18 and 20 can be performed without power cycling and without any manipulation of jumper connections of the switching circuits 16, 18 and 20.

In certain embodiments, the processor 72 is configured to reprogram the switching circuit such as 16 based upon the identification code of the target and to lock the switching circuit 16 against further reteaching based upon other identification codes of any other targets prior to reaching an allowed number of reteaching attempts. In one exemplary embodiment, the allowed number of reteaching attempts is 8. However, a greater or lesser number may be assigned for the allowed number of reteaching attempts. It should be noted that an operator of the system may lock the switching circuit 16 either immediately after commissioning or after any subsequent successful learn of the switching circuit 16 for a target 64.

In operation, the target 64 is presented within the sensing range of the sensor 62 for a pre-determined duration and the identification code of the target 64 is acquired via the sensor 62. In this exemplary embodiment, the pre-determined duration is about 15 seconds. Further, the acquired identification code is stored in the memory 70. The switching circuit 16 may be subsequently locked against learning identification codes of any other target prior to reaching the allowed number of reteaching attempts.

In this exemplary embodiment, each of the switching circuits 16, 18 and 20 includes one or more light emitting diodes (LEDs), such as represented by reference numeral 76 for identifying location of faults in the installation 10. For example, a green light emitted by the LED 76 of the switching circuit 16 indicates that the target 64 is within the sensing range of the sensor 62 and the switching circuit 16 is functioning properly. Similarly, a flashing red light emitted by the LED 76 of the switching circuit 18 indicates that the switching circuit 18 has a fault and is not functioning properly. Further, a red light emitted by the LED 76 of the switching circuit 20 indicates that the target 64 is outside the sensing range of sensor 62. Thus, based upon indications from the LED 76 of the various switching circuits 16, 18 and 20 any faults within the installation 10 may be detected and corrected.

Figure 5:
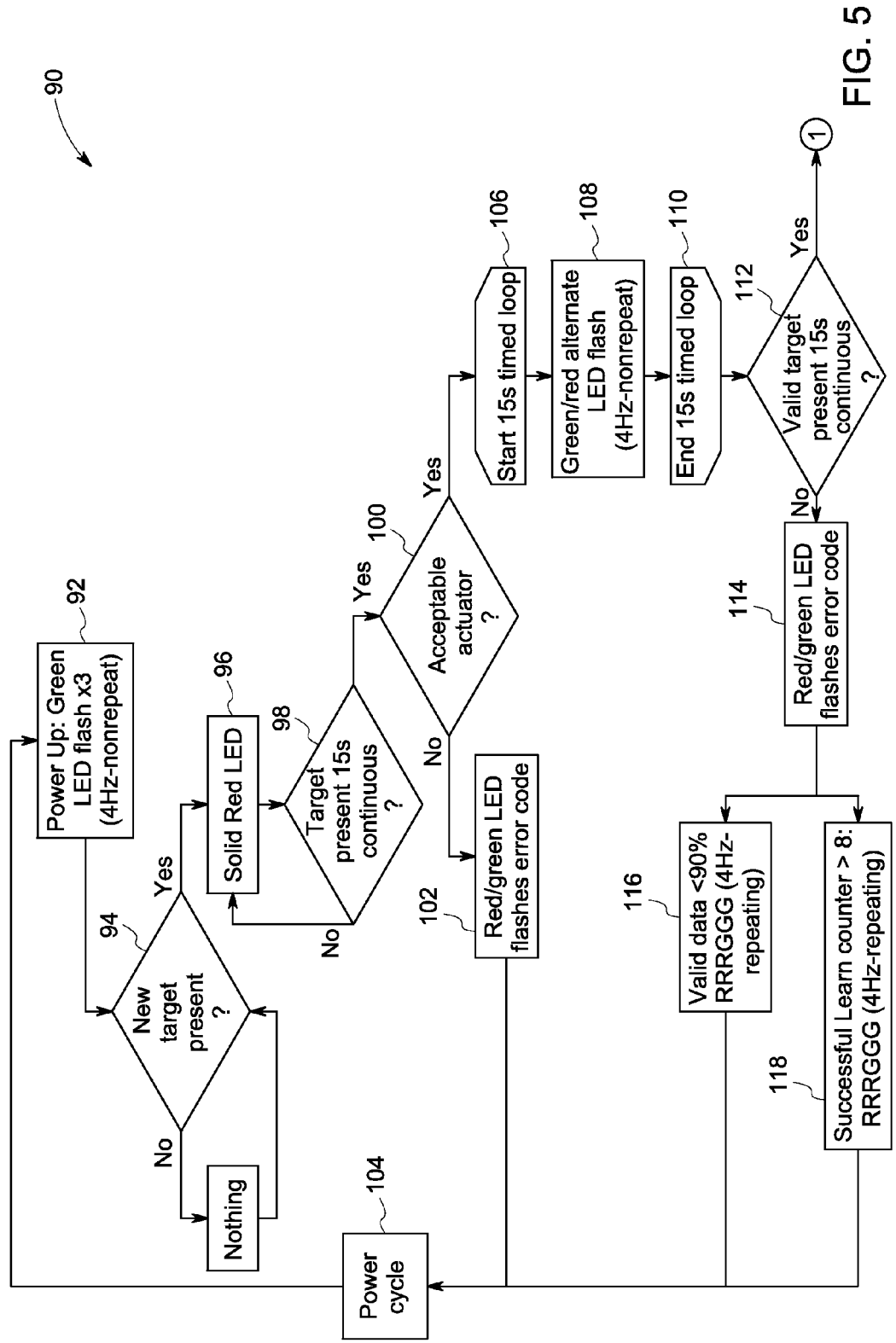
FIG. 5 illustrates an exemplary process of reteaching the switching circuits of FIG. 4 in accordance with aspects of the present invention.

FIG. 5 illustrates an exemplary process 90 of reteaching the switching circuits 16, 18 and 20 of FIG. 4. At block 92, the process is initiated and the power is supplied to the switching circuit. Further, a target is presented within the sensing range of the sensor of the switching circuit. At block 94, the presence of the new target is detected and a solid red light is displayed by the LED of the switching device to indicate the absence of a learned target. In the illustrated embodiment, the target is presented in the sensing range for a pre-determined duration. In one exemplary embodiment, the pre-determined duration is about 15 secs. At block 98, it is validated if the target is present for the pre-determined duration.

Further, it is verified if the target is an acceptable actuator for the switching circuit (block 100). If the target is not an acceptable actuator then the switching device displays an error code using the LED of the switching device, as represented by block 102. In this exemplary embodiment, power cycling of the switching device is required for the switching device for an unacceptable target, as represented by block 104.

Alternatively, once an acceptable target is detected, then the switching device proceeds with reteaching of the switching device for the target by acquiring the identification code of the target via the sensor. At block 106, a timed loop with a pre-determined duration is initiated. In this exemplary embodiment, the timed loop has duration of about 15 seconds. During the timed loop, green and red light may be displayed alternately by the LED of the switching device (block 108). The timed loop is completed after the pre-determined duration, as represented by block 110. At block 112, the switching device validates if the target was present continuously during the timed loop. If the target was not present within the sensing range of the sensor for the entire duration of the timed loop, then an error code is displayed by the switching device (block 114).

At block 116, the sensed data during the timed loop is compared to validate the acquired identification code of the target and power cycling of the switching device is performed if the acquired code is invalid (block 104). In this exemplary embodiment, the identification code of the target is repeatedly sensed within the timed loop and is compared to validate the acquired code. At block 118, the switching device verifies if the current reteaching attempt is less than an allowed number of reteaching attempts. If the current reteaching attempt is greater than the allowed number of reteaching attempts, then an error code sequence is initiated, requiring power cycling.

Once the acquired identification code of the target is validated, it is compared with all stored identification codes of other targets previously used by the switching circuit as a basis for switching. Further, the switching circuit is retaught based on the acquired identification code only if the acquired code is different from all stored identification codes of other targets previously used by the switching circuit as a basis for switching. The acquired identification code is then stored for operating the switching circuit.

Figure 6:
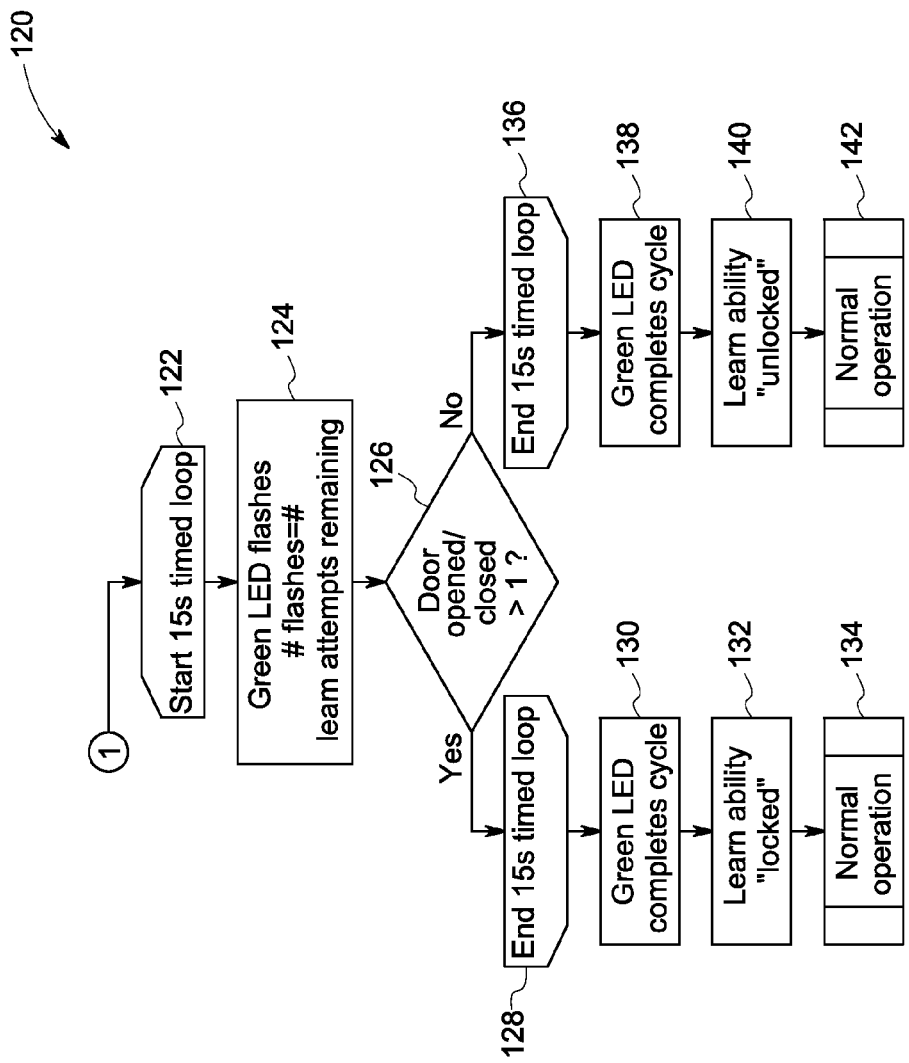
FIG. 6 illustrates an exemplary process of locking the switching circuits of FIG. 4 against learning of identification codes of new targets in accordance with aspects of the present invention.

Further, the switching circuit may be locked against learning identification codes of any other target prior to reaching an allowed number of reteaching attempts, as illustrated by exemplary process 120 of FIG. 6. At block 122, a timed loop for a pre-determined period for a valid target is initiated. In this exemplary embodiment, duration of the pre-determined period is about 15 secs. At block 124, number of available reteaching attempts is displayed by the LED of the switching device. Further, it is verified if the target is moved outside the sensing range of the sensor and is represented within the sensing range within the pre-determined period (block 126).

In this exemplary embodiment, opening and closing of a movable component such as an access door where the target is mounted is monitored to verify if the target is moved outside and is re-presented within the sensing range. In one exemplary embodiment, if the opening and closing of the movable component is performed at least once during the pre-determined period, then the locking of the switching device is initiated. At block 128, the timed loop is ended and a green light is displayed by the LED of the switching device to indicate the completion of the timed loop (block 130). At block 132, the switching device is locked against learning identification codes of any other target. Further, the switching device is operated with the acquired identification code of the target (block 134).

If the opening and closing of the movable component is not performed at least once during the pre-determined period and the timed loop is completed, as represented by blocks 136 and 138, then the learning ability of the switching device is in the unlocked state (block 140). Thus, the switching device is open for learning identification codes of other target presented within the sensing range of the sensor of the switching device. Again, the switching device is operated with the acquired identification code of the target (block 142).

Figure 7:
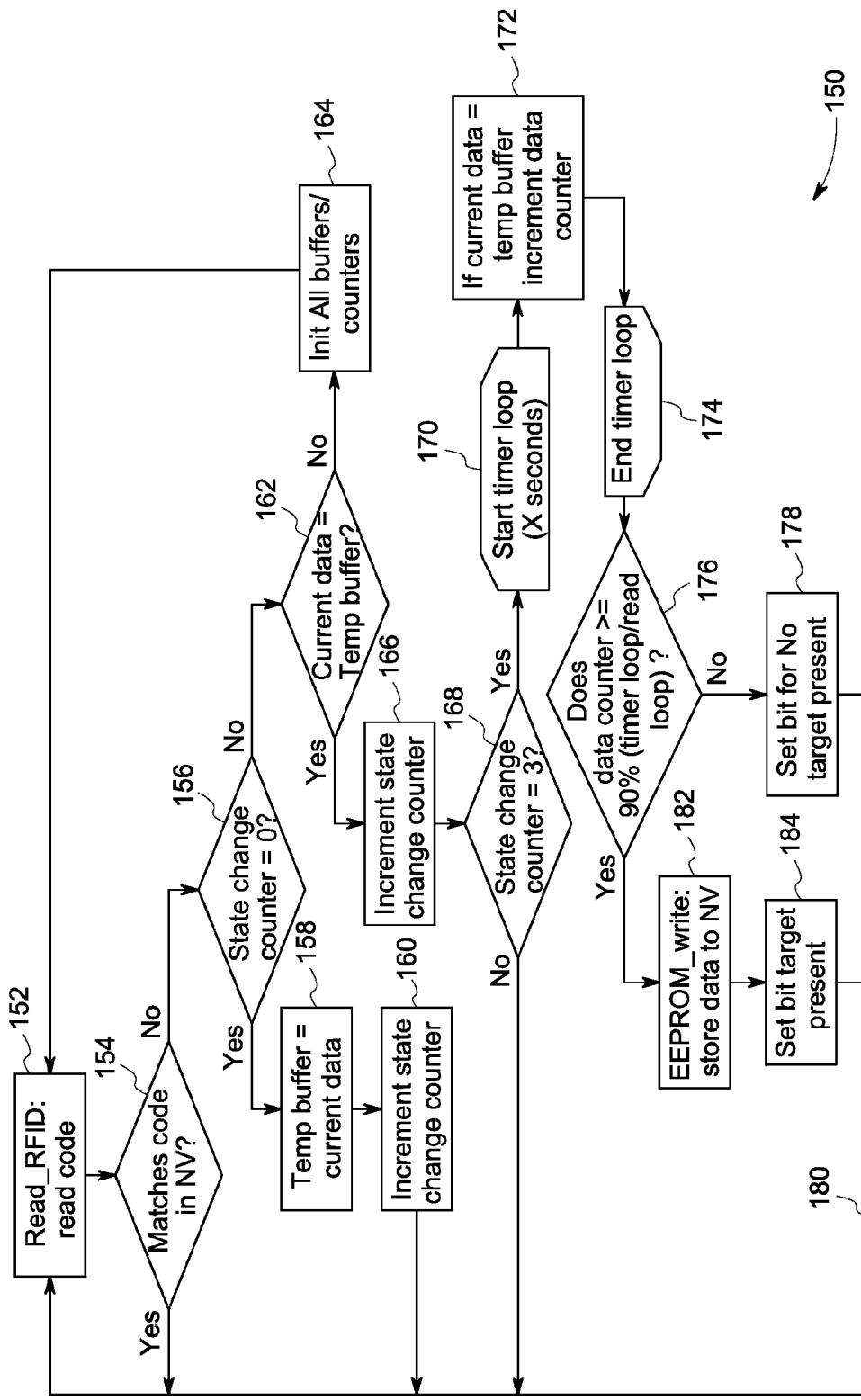
FIG. 7 illustrates exemplary process steps of identifying a valid target for reteaching the switching circuit of FIG. 4 in accordance with aspects of the present invention.

FIG. 7 illustrates exemplary process steps 150 of identifying a valid target for reteaching the switching circuit 16 of FIG. 4. At block 152, the identification code of the target is acquired using the sensor of the switching device. In this exemplary embodiment, the identification code includes a 16-bit word. In this embodiment, the sensor generates a radio frequency field at a frequency of about 125 kHz and the target is a passive resonant circuit that responds to the excitation by the radio frequency field. At block 154, the acquired identification code is compared with currently learned stored identification code used by the switching circuit as a basis for switching. If the acquired identification code is identical to the currently stored code, then a new code is not learnt and the switch continues normal operation.

If the acquired identification code is different from the currently stored identification code used by the switching circuit as a basis for switching, then it is verified if the state change counter of the switching device is equal to zero (block 156). The state change counter serves as a filter to ensure that not every new identification code is validated by the process. The state change counter is incremented if a reading matches the previous. If three readings in a row match, the validation process is triggered. If the state change counter is equal to zero, then a buffer is set equal to the current data and the state change counter is incremented (blocks 158 and 160). The sensor then acquires the next data reading.

Alternately, if the state change counter is not equal to zero, then it is verified if the current sensed data is equal to the buffer (block 162). If the current sensed data is not equal to the buffer, then the buffer and the counters are initialized, as represented by block 164. The sensor then acquires the next reading of the target.

If the current sensed data is equal to the buffer, then the state change counter is incremented and it is verified if the state change counter is equal to three (blocks 166 and 168). The state change counter serves as a filter to ensure that not every new identification code is validated by the process. The state change counter is incremented if a reading matches the previous. If three readings in a row match, the validation process is triggered. If the state change counter is not equal to three, then the sensor proceeds to acquire the next reading corresponding to the target in the sensing range of the sensor.

Alternately, if the state change counter is equal to three, then a timer loop of pre-determined period is initiated (block 170). In one exemplary embodiment, the pre-determined period of the timer loop is about 15 seconds. At block 172, if the current sensed data is equal to the temp buffer, then the data counter is incremented before the timer loop is completed, as represented by block 174.

At block 176, it is verified if the data counter is greater than or equal to a pre-determined threshold. In this embodiment, the pre-determined threshold is about 90%. If the data counter is less than the pre-determined threshold, then the output is set for no target present in the sensing range of the sensor (block 178). Subsequently, all buffers and counters are initialized, as represented by block 180. Alternatively, if the data counter is greater than or equal to the pre-determined threshold, then the sensed data is stored in the memory and the output is set for target present in the sensing range of the sensor (block 184). Again, all buffers and counters are initialized, as represented by block 180. Thus, once a valid target is detected, the switching circuit may be reprogrammed for the corresponding target and the identification code of the target is stored for operation of the switching circuit.

As will be appreciated by those of ordinary skill in the art, the foregoing example, demonstrations, and process steps may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, such as C++ or JAVA. Such code, as will be appreciated by those of ordinary skill in the art, may be stored or adapted for storage on one or more tangible, machine readable media, such as on memory chips, local or remote hard disks, optical disks (that is, CD's or DVD's), or other media, which may be accessed by a processor-based system to execute the stored code. Note that the tangible media may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory The various aspects of the structures described hereinabove may be used for reteaching switching circuits for various machines. In the installations discussed above, the present techniques would be used to limit access to a workspace, machine, or the like. Many other applications exist, however, for verifying position of a movable component with respect to a stationary component (or the position of two movable components with respect to one another) that may be the subject of application of the presently claimed techniques. In particular, the technique may be employed for machines where multiple access doors are required to be monitored employed in industries such as material handling, packaging, life sciences and fiber and textiles, to name just a few. As described above, the technique utilizes a reteaching method for training the switching circuit for a target without operator manipulation of the switching circuit. Thus, any machine with a damaged target can resume working with new targets in relatively lesser time without requiring complex or disruptive steps such as cycling power etc.

The technique described above also provides locking of the switching circuit against learning of codes of new targets prior to reaching an allowed number of reteaching attempts. Advantageously, the technique facilitates reteaching of the switching circuit for a new target in an event where the target has been damaged in the field while preventing by-passing of the switch by using any spare targets taped to the face of the switch by the operator/maintenance personnel thereby providing a robust and secure switching device.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for teaching a switching circuit, comprising:
   acquiring an identification code of a target via a sensor when the target is presented within a sensing range of the sensor for a pre-determined duration;
   storing the acquired identification code for operating the switching circuit; and
   locking the switching circuit against learning identification codes of any other target, wherein locking the switching circuit against learning comprises moving the target outside the sensing range of the sensor and re-presenting the target within the sensing range of the sensor within a pre-determined period.

2. The method of claim 1, wherein the sensor is disposed on a stationary component and the target comprises an actuator disposed on a movable component within the sensing range of the sensor.

3. The method of claim 1, wherein the pre-determined duration is about 15 seconds.

4. The method of claim 1, comprising detecting the target within the sensing range of the sensor through radio-frequency identification.

5. The method of claim 1, wherein the moving and re-presenting steps are performed at least once within the pre-determined period.

6. The method of claim 1, wherein the pre-determined period is about 15 seconds.

7. The method of claim 1, further comprising operating the switching circuit with the acquired identification code of the target presented.

8. The method of claim 2, wherein moving the target comprises opening the movable component to move the target outside the sensing range of the sensor and re-presenting the target comprises closing the movable component to re-present the target within the sensing range of the sensor.

9. The method of claim 8, wherein the opening and closing steps are performed at least once within the pre-determined period.

10. A reteachable switching circuit, comprising:
    a non-contact sensor configured to be disposed on a frame of an access door configured to provide access to at least one electrically driven device for an industrial application, the sensor having a sensing range;
    a target configured to be disposed on the access door, wherein the target is located within the sensing range of the sensor when the access door is closed, and the target is located outside of the sensing range of the sensor when the access door is open; and
    a processor configured to reprogram the switching circuit for operation of the switching circuit based upon an identification code of the target sensed by the sensor and to prevent the switching circuit from learning any other identification code of any other target sensed by the sensor, wherein the processor is configured to prevent the switching circuit from learning any other identification code when the target moves outside the sensing range of the sensor and is re-presented the target within the sensing range within a pre-determined period.

11. The reteachable switching circuit of claim 10, further comprising a memory configured to store the identification code of the target.

12. The reteachable switching circuit of claim 10, wherein the sensor generates a radio frequency field at approximately 125 kHz, and the target is a passive resonant circuit that responds to excitation by the radio frequency field.

13. The reteachable switching circuit of claim 10, wherein the identification code of the target comprises a 16 bit word.

14. The reteachable switching circuit of claim 10, wherein the identification code of the target is sensed within about 15 seconds.

15. The reteachable switching circuit of claim 10, further comprising one or more light emitting diodes configured to indicate a status of the switching circuit, the sensor, the target, or any combination thereof.

16. The reteachable switching circuit of claim 15, wherein the status is indicated by:
    illuminating a first light emitting diode of the one or more light emitting diodes;
    oscillating an illumination of the first light emitting diode;
    illuminating a second light emitting diode of the one or more light emitting diodes; or
    any combination of the above.

17. The reteachable switching circuit of claim 16 wherein illuminating the first light emitting diode of the one or more light emitting diodes corresponds to the target being within the sensing range of the sensor, wherein oscillating the illumination of the first light emitting diode corresponds to the target being outside of the sensing range of the sensor, and wherein illuminating the second light emitting diode of the one or more light emitting diodes corresponds to the switching circuit not functioning properly.

* * * * *